United States Patent [19]
Perng

[11] Patent Number: 6,033,997
[45] Date of Patent: Mar. 7, 2000

[54] REDUCTION OF BLACK SILICON IN SEMICONDUCTOR FABRICATION

[75] Inventor: Dung-Ching Perng, San Jose, Calif.

[73] Assignee: Siemens Aktiengesellschaft, Munich, Germany

[21] Appl. No.: 08/998,858

[22] Filed: Dec. 29, 1997

[51] Int. Cl.[7] ................................................. H01L 21/027
[52] U.S. Cl. ...................... 438/765; 438/758; 438/778; 438/780; 438/787; 438/791
[58] Field of Search .................................... 438/758, 765, 438/778, 780, 787, 791

[56] References Cited

U.S. PATENT DOCUMENTS

| | | | |
|---|---|---|---|
| 5,229,318 | 7/1993 | Straboni et al. | 438/445 |
| 5,298,442 | 3/1994 | Bulucea et al. | 438/270 |

Primary Examiner—Randy Gulakowski
Assistant Examiner—Allan Olsen
Attorney, Agent, or Firm—Stanton C. Braden

[57] ABSTRACT

Reduction of black silicon is achieved by providing a dielectric layer in at least the bead region of the wafer before the formation of a hard etch mask.

1 Claim, 2 Drawing Sheets

REDUCTION OF BLACK SILICON IN SEMICONDUCTOR FABRICATION

FIELD OF THE INVENTION

The invention generally relates to semiconductor fabrication and, more particularly, to reducing the formation of black silicon.

BACKGROUND OF THE INVENTION

In the fabrication of integrated circuits (ICs) or chips, vias or trenches are typically created in the substrate, such as a silicon wafer, for various purposes. The vias or trenches are formed by etching into the substrate. Deep trenches (DTs), for example, serve as trench capacitors for an array of memory cells.

Conventionally, DTs are formed by first providing a pad stack over the surface of the wafer. The pad stack includes, for example, sequential layers of a pad oxide and a pad nitride. Above the pad stack is a hard mask layer comprising, for example, TEOS. The hard mask layer serves as a hard etch mask used to form the DTs.

A photoresist layer is deposited over the hard mask and patterned to selectively expose areas in the array region where the DTs are to be formed. Typically, the exposed regions of the hard mask, along with the pad stack below, are removed by a reactive ion etch (RIE) to expose the wafer. The photoresist is removed, and the exposed wafer regions are etched by RIE to create the DTs.

Conventional techniques for forming the hard mask layer result in uneven coverage of the hard mask material on the wafer. In particular, less material covers the edges and sides than the other regions of the wafer. As a result, the hard mask at the edges and sides is eroded away during the latter stages of the DT etch, exposing the pad stack beneath. This in turn causes the pad stack to be eroded away, exposing the wafer surface underneath. As the DT etch continues, formation of needle type surface at the exposed regions of the wafer results. Such needle type surface is referred to as "black silicon." A description of black silicon can be found in, for example, V. W. Hess, Solid State Technology, April 1981, p. 192 and G. K. Herb, Solid State Technology, October 1989, p. 104, which are hereby incorporated by reference for all purposes.

Black silicon forms because oxide islands are left on the wafer surface during DT etch. The oxide protects the underlying silicon from being etched. As such, the portions unprotected by the oxide continue to be etched, while the protected portions remain. As the RIE proceeds, the protected portions results in the formation of needles or spikes.

The formation of black silicon during RIE creates difficulties in the handling of the wafer. For example, the black silicon spikes are easily broken off and can adversely impact manufacturing yield.

One conventional technique of preventing the formation of black silicon is to employ a clamp ring to cover the wafer edge, protecting it during hard mask open RIE. However, the use of the clamp ring causes clamp finger shadowing, which affects lithographic resolution or reliability and etch uniformity. As a result, chip yield is reduced. Additionally, the use of the clamp ring prevents the use of electric static chuck (ESC) equipped tools, which are required in high density plasma etch tools.

From the foregoing discussion, it is desirable to provide an improved technique of fabricating semiconductor devices without the formation of black silicon.

SUMMARY OF THE INVENTION

The invention relates to the reduction of black silicon during the fabrication of semiconductor devices. In one embodiment, the formation of black silicon is reduced by removing the pad stack from at least the bead and sides of the wafer and forming a dielectric layer therein. The dielectric layer, for example, comprises oxide formed by thermal oxidation. A hard mask is then formed on the wafer surface. The dielectric layer in at least the bead region and sides of the wafer provides additional protection during DT etch, reducing or preventing the formation of black silicon.

DESCRIPTION OF THE INVENTION

The present invention relates to prevention of black silicon during the fabrication of integrated circuits (ICs). The ICs, for example, include memory circuits such as random access memories (RAMs), dynamic RAMs (DRAMs), synchronous DRAMs (SDRAMs), static RAMs (SRAMs), or read only memories (ROMs). Also, the ICs may include logic devices such as a programmable logic arrays (PLAs), application specific ICs (ASICs), merged DRAM-logic ICs (embedded DRAMs), or any other circuit devices.

Typically, numerous ICs are fabricated on a substrate, such as a silicon wafer, in parallel. After processing, the wafer is diced in order to separate the ICs into a plurality of individual chips. The chips are then packaged into final products for use in, for example, consumer products such as computer systems, cellular phones, personal digital assistants (PDAs), and other products.

Figure 1:
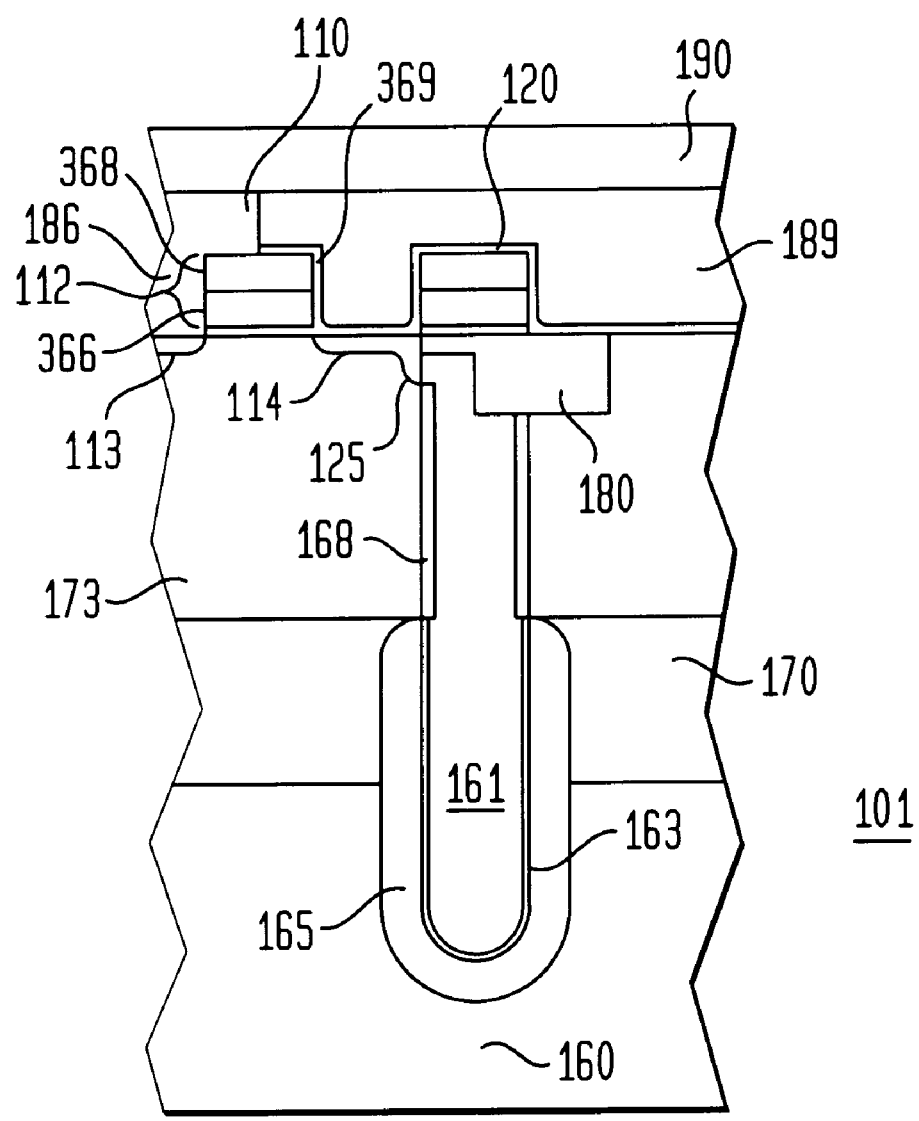
FIG. 1 shows a DRAM cell.

For purpose of discussion, a description of a conventional DRAM cell is provided. Referring to FIG. 1, a trench capacitor DRAM cell is shown. Such DRAM cell is described in, for example, Nesbit et al., A 0.6 $\mu m_2$ 256 Mb Trench DRAM Cell With Self-Aligned Buried Strap (BEST), IEDM 93-627, which is herein incorporated by reference for all purposes.

As shown, the DRAM cell includes a trench capacitor 160 formed in a substrate 101. The trench is filled with, typically, polysilicon (poly) 161 that is heavily doped with n-dopants. The poly serves as an electrode of the capacitor, is referred to as a "storage node." Optionally, a buried plate 165 doped with n-type dopants surrounds the lower portion of the trench. The buried plate serves as a second electrode of the capacitor. In the upper portion of the trench is a collar 168 for reducing parasitic leakage. A node dielectric 163 separates the two plates of the capacitor. A buried well 170 comprising n-type dopants is provided to connect the buried plates of the DRAM cells in the array. Above the buried well is a p-well 173. The p-well reduces vertical leakage.

The DRAM cell also comprises a transistor 110. The transistor includes a gate 112 and diffusion regions 113 and 114 comprising n-type dopants. The diffusion regions are referred to as the source and drain. The designation of source and drain depends on the operation of the transistor. Connection of the transistor to the capacitor is achieved via a diffusion region 125, referred to as the "node diffusion." The gate, also referred to as the "wordline," typically comprises poly 366 and nitride 368 layers. Alternatively, layer 366 is a polycide layer which comprises silicide, such as molybdenum ($MoSi_x$), tantalum ($TiSi_x$), tungsten ($WSi_x$), titanium ($TiSi_x$), or cobalt ($CoSi_x$), over a layer of poly to reduce wordline resistance.

In one embodiment, the polycide layer comprises $WSi_x$ over poly. A nitride liner 369 covers the gate stack and substrate. The nitride layer 368 and nitride liner serves as an etch or polish stop layer for subsequent processing.

A shallow trench isolation (STI) 180 is provided to isolate the DRAM cell from other cells or devices. As shown, a wordline 120 is formed over the trench and isolated therefrom by the STI. Wordline 120 is referred to as the "passing wordline." Such configuration is referred to as a folded bitline architecture. Other configurations such as open or open-folded bitline architectures or cell designs are also useful.

An interlevel dielectric layer 189 is formed over the wordlines. A conductive layer, representing a bitline, is formed over the interlevel dielectric layer. A bitline contact opening 186 is provided in the interlevel dielectric layer to contact the source 113 to the bitline 190.

A plurality of such cells is configured in an array. The array of cells is interconnected by wordlines and bitlines. Access to a cell is achieved by activating the cell's corresponding wordline and bitline.

Figure 2A:
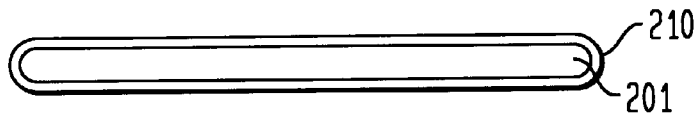
FIGS. 2a–e shows an embodiment of the invention for preventing formation of black silicon during fabrication of integrated circuits.

Referring to FIG. 2a, a substrate 201 on which integrated circuits are formed is shown. The substrate, for example, is a silicon wafer. Other types of substrate, such as silicon on insulator (SOI), silicon on sapphire (SOS), germanium, gallium arsenide, or group III–V compounds, are also useful.

As shown, a pad stack 210 is formed on the wafer. The pad stack conformally covers wafer surfaces, including the sides and bottom. The pad stack typically comprises a pad oxide layer and a pad stop layer. The pad oxide layer is deposited by, for example, low pressure chemical vapor deposition (LPCVD) or other know techniques such as thermal oxidation. The pad oxide is sufficiently thick to reduce stress and promote adhesion between the pad stop layer with the wafer. Typical thickness of the pad oxide layer is about 5–20 nm, preferably about 10 nm.

Above the pad oxide is the pad stop layer. The pad stop layer comprises material having sufficient selectivity to other material, such as that used to fill the DTs, to serve as an efficient etch or CMP stop layer. In one embodiment, the pad stop layer comprises silicon nitride ($Si_3N_4$) due to its relatively low etch rate to the polysilicon used to fill the trenches. Other appropriate etch or CMP stop materials are also useful to form the pad stop layer. The nitride layer is deposited by, for example, low pressure chemical vapor deposition (LPCVD). Other techniques for depositing the nitride layer, such as plasma enhanced chemical vapor deposition (PECVD), are also useful. Typically, the pad nitride layer is about 100–300 nm thick, preferably about 200–220 nm. The thickness may, however, vary depending the application and CMP performance or etch efficiency as well as etch selectivity between the nitride and resist used to pattern the nitride.

Although, as described, the pad stack comprises a pad oxide and pad stop layers, additional layers may be included depending on the application.

In one embodiment, the pad stack is patterned to protect the upper wafer surface in at least the region of the wafer in which ICs are formed. The term "primary chip region" is used herein to refer to the region of the wafer in which ICs are formed. The pad stack is usually patterned to extend beyond the primary chip region in the upper wafer surface. Typically, the pad stack is patterned to protect the upper surface of the wafer, leaving about a 3 mm wide region from the edge, sides, and bottom unprotected. The region at the edge of the wafer is typically referred to as the "bead" region. The width of the bead region on the upper surface may be varied in accordance with specific designs and layout of the chips on the wafer.

Figure 2B:
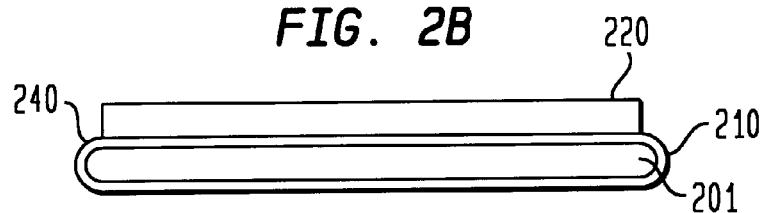

Patterning of the pad stack, in one embodiment, is achieved by depositing a mask layer 220 on the wafer to cover the pad stack, as shown in FIG. 2b. The mask layer comprises, for example, photoresist deposited by a spin-on technique. Backside rinse and bead removal using conventional techniques are employed to remove the resist from the bottom, side, and the bead region. As a result, a block mask 220 remains to protect the pad stack on upper surface of the wafer except for the bead region 240. Typically, the width of the bead region is about 3 mm.

Figure 2C:
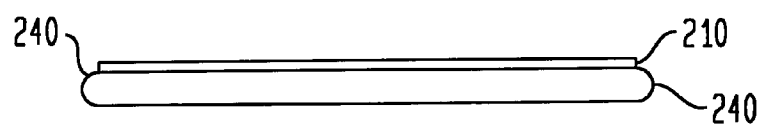

Referring to FIG. 2c, the unprotected portions of the pad stack are removed to expose the wafer surface thereunder. Illustratively, the surface at the bead region, sides, and bottom of the wafer are exposed. In one embodiment, a wet etch is used to remove the unprotected portions of the pad stack. The wet etch employs known chemistry, such as HF/Glycerol solution or other appropriate wet etch chemistry, to remove materials that comprise the pad stack. The block mask is then removed, leaving the pad stack 210 over the primary chip region.

Figure 2D:
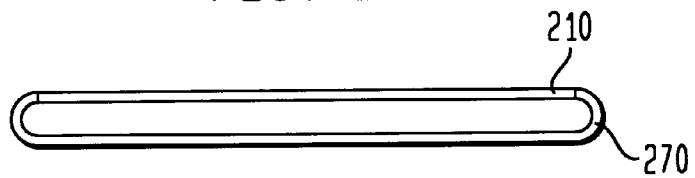

In FIG. 2d, a dielectric layer 270 is then formed on the wafer. In one embodiment, the dielectric layer comprises oxide formed by thermal oxidation. The thermal oxidation is selective to the wafer surface. That is, the oxide is formed on the wafer surface unprotected by the pad stack because the pad stack prevents oxygen from diffusing to the wafer surface beneath. In the case where the upper layer of the pad stack is nitride, the nitride becomes oxidized to form oxynitride. The thickness of the oxide layer is sufficient to prevent the DT etch from exposing the silicon surface during the latter stages of trench formation. The oxide layer is typically about 1 um thick.

Figure 2E:
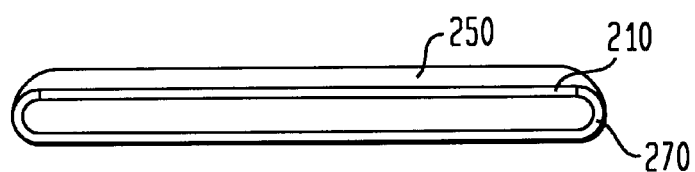

Referring to FIG. 2e, a hard mask layer 250 is formed over the wafer. The hard mask comprises, in one embodiment, borosilicate glass (BSG). Other materials which have a high etch selectivity to silicon can also be used as a hard etch mask. Such materials include, for example, oxide formed from TEOS, are also useful. The hard etch mask serves as the mask for etching DTs. The thickness of the hard mask layer is, for example, about 700 nm. This thickness, however, may vary depending on the depth of the DTs and the etch process that is employed.

The hard mask layer is patterned using conventional lithographic techniques to define regions in which DTs are formed. Such techniques include depositing a photoresist layer and selectively exposing it with an exposure source and mask. Either exposed or unexposed portion of the resist, depending on whether it is a positive or negative type resist, is removed during development. As a result, the hard mask in the DT regions is unprotected by the resist layer. The hard mask material along with the other layers of the pad stack in the DT regions are then removed, exposing the silicon wafer underneath. Removal of the pad stack layers is achieved by, for example, for example, RIE.

After the pad stack has been patterned, a DT etch is performed to create the DTs. The DT etch, for example, is a RIE. The oxide layer 270 provides additional protection at the bead region and sides of the wafer. As a result, the DT etch does not penetrate through to the wafer in the bead region and sides, preventing the formation of black silicon in these regions.

The process continues to form the remaining portions of the ICs. This, for example, includes forming a plurality of DRAM cells as described in FIG. 1, along with support devices to fabricate DRAM chips.

While the invention has been particularly shown and described with reference to various embodiments, it will be recognized by those skilled in the art that modifications and changes may be made to the present invention without departing from its scope. The scope of the invention should therefore be determined not with reference to the above description but with reference to the appended claims along with their full scope of equivalents.

I claim:
1. A process for fabricating semiconductor devices including a process for reducing the formation of black silicon comprising:
   providing a wafer;
   forming a pad stack on at least a major surface of the wafer;
   patterning the pad stack to protect the primary chip region of the major surface of the wafer while leaving the bead region unprotected; and
   forming a dielectric layer on regions of the wafer unprotected by the pad stack, the dielectric layer providing additional protection during subsequent etch process to reduce the formation of black silicon.

* * * * *